United States Patent
Ott et al.

(10) Patent No.: US 11,517,972 B2
(45) Date of Patent: Dec. 6, 2022

(54) SYSTEMS FOR IMPROVING SIGNAL QUALITY OF COMMAND/CONTROL SIGNALS TO BE TRANSMITTED OVER A WELD CABLE

(71) Applicant: ILLINOIS TOOL WORKS INC., Glenview, IL (US)

(72) Inventors: Brian Lee Ott, Sherwood, WI (US); Quinn William Schartner, Kaukauna, WI (US)

(73) Assignee: Illinois Tool Works Inc., Glenview, IL (US)

( * ) Notice: Subject to any disclaimer, the term of this patent is extended or adjusted under 35 U.S.C. 154(b) by 368 days.

(21) Appl. No.: 14/691,380

(22) Filed: Apr. 20, 2015

(65) Prior Publication Data

US 2015/0224591 A1     Aug. 13, 2015

Related U.S. Application Data

(63) Continuation of application No. 11/609,871, filed on Dec. 12, 2006, now Pat. No. 9,012,807, which is a
(Continued)

(51) Int. Cl.
*B23K 9/095*     (2006.01)
*B23K 9/10*      (2006.01)
(Continued)

(52) U.S. Cl.
CPC ................ *B23K 9/10* (2013.01); *B23K 9/095* (2013.01); *B23K 9/1087* (2013.01); *B23K 9/124* (2013.01);
(Continued)

(58) Field of Classification Search
CPC ....... B23K 9/10; B23K 9/1087; B23K 9/1031
(Continued)

(56) References Cited

U.S. PATENT DOCUMENTS 2,043,331 A   6/1936   Notvest
2,175,891 A   10/1939  Graham
(Continued)

FOREIGN PATENT DOCUMENTS

EP   0575082    12/1993
EP   1586403    10/2005
(Continued)

OTHER PUBLICATIONS

Intellon, "CEBus Power Line Encoding and Signaling," White Paper #0027, Mar. 1997, Version 0.1, pp. 1-6.
(Continued)

*Primary Examiner* — Helena Kosanovic
*Assistant Examiner* — Ayub A Maye
(74) *Attorney, Agent, or Firm* — McAndrews Held & Malloy, Ltd.

(57) ABSTRACT

The present invention is directed to a system and method of remotely controlling a welding machine with command signals transmitted to the welding power source across a weld cable connecting the power source to a remote device, such a wire feeder. A transmitter transmits the control commands containing desired welding operational parameters to a receiver disposed in the power source across a weld cable also designed to carry welding power from the power source to the wire feeder.

18 Claims, 7 Drawing Sheets

Related U.S. Application Data continuation-in-part of application No. 11/276,288, filed on Feb. 22, 2006, now Pat. No. 8,592,724, which is a continuation-in-part of application No. 10/709,148, filed on Apr. 16, 2004, now Pat. No. 7,180,029.

(51) Int. Cl.

| | |
|---|---|
| *B23K 9/12* | (2006.01) |
| *H04B 3/54* | (2006.01) |
| *H04L 1/18* | (2006.01) |
| *H04L 27/18* | (2006.01) |
| *H03C 3/00* | (2006.01) |
| *H03C 5/00* | (2006.01) |

(52) U.S. Cl.
CPC ............... *H03C 3/00* (2013.01); *H03C 5/00* (2013.01); *H04B 3/546* (2013.01); *H04L 1/1867* (2013.01); *H04L 27/18* (2013.01); *H04B 2203/547* (2013.01); *H04B 2203/5458* (2013.01); *H04B 2203/5483* (2013.01); *H04B 2203/5491* (2013.01)

(58) Field of Classification Search
USPC .......................... 219/130.1, 130.01, 137 PS
See application file for complete search history.

(56) References Cited

U.S. PATENT DOCUMENTS

| | | | |
|---|---|---|---|
| 2,526,597 A | 10/1950 | Winslow | |
| 2,585,772 A * | 2/1952 | Hasley | B23K 11/248 |
| | | | 219/91.2 |
| 2,617,913 A | 11/1952 | Sol | |
| 2,642,515 A | 6/1953 | Bagg | |
| 3,496,328 A | 2/1970 | Moerke | |
| 3,594,541 A * | 7/1971 | Gorman | B23K 9/0738 |
| | | | 219/137 R |
| 3,728,582 A * | 4/1973 | Agnew | H02H 11/001 |
| | | | 361/48 |
| 3,992,565 A | 11/1976 | Gatfield | |
| 4,051,344 A | 9/1977 | Robbins | |
| 4,079,231 A | 3/1978 | Toth | |
| 4,119,830 A | 10/1978 | Gilliland | |
| 4,147,919 A | 4/1979 | Matasovic | |
| 4,216,367 A | 8/1980 | Risberg | |
| 4,216,368 A | 8/1980 | Delay | |
| 4,227,066 A | 10/1980 | Bulwidas | |
| 4,247,751 A | 1/1981 | Ashton | |
| 4,247,752 A | 1/1981 | Stringer | |
| 4,266,114 A | 5/1981 | Hansen | |
| 4,280,018 A * | 7/1981 | Lazarus | G10H 3/143 |
| | | | 381/114 |
| 4,410,789 A | 10/1983 | Story | |
| 4,450,340 A | 5/1984 | Corrigall | |
| 4,467,174 A | 8/1984 | Gilliland | |
| 4,508,954 A | 4/1985 | Kroll | |
| 4,521,672 A | 6/1985 | Fronius | |
| 4,531,045 A | 7/1985 | Gerrit | |
| 4,561,059 A | 12/1985 | Davis | |
| 4,584,685 A | 4/1986 | Gajjar | |
| 4,608,482 A | 8/1986 | Cox | |
| 4,641,292 A | 2/1987 | Tunnell | |
| 4,672,632 A * | 6/1987 | Andersen | H04L 25/49 |
| | | | 375/284 |
| 4,767,908 A | 8/1988 | Dallavalle | |
| 4,769,754 A * | 9/1988 | Reynolds | B23K 9/091 |
| | | | 219/130.21 |
| 4,812,764 A * | 3/1989 | Bendall | G01R 33/365 |
| | | | 324/318 |
| 4,862,088 A * | 8/1989 | Etienne | G01L 9/12 |
| | | | 324/326 |
| 4,910,482 A * | 3/1990 | Takagai | H01F 38/02 |
| | | | 333/12 |
| 4,918,517 A | 4/1990 | Burgoon | |
| 4,973,821 A * | 11/1990 | Martin | B23K 9/125 |
| | | | 219/130.51 |
| 4,975,920 A * | 12/1990 | Egawa | H01S 3/0975 |
| | | | 372/38.04 |
| 5,039,835 A | 8/1991 | Schwiete | |
| 5,043,557 A * | 8/1991 | Tabata | B23K 9/1056 |
| | | | 219/130.51 |
| 5,063,282 A | 11/1991 | Gilliland | |
| 5,148,000 A * | 9/1992 | Tews | B23K 9/1087 |
| | | | 219/125.11 |
| 5,262,609 A * | 11/1993 | Nowak | B23K 11/256 |
| | | | 219/109 |
| 5,276,305 A * | 1/1994 | Hsien | B23K 9/1062 |
| | | | 219/132 |
| 5,376,894 A | 12/1994 | Petranovich | |
| 5,406,050 A | 4/1995 | Macomber | |
| 5,653,902 A | 8/1997 | Chang | |
| 5,834,916 A | 11/1998 | Shimogama | |
| 5,902,506 A * | 5/1999 | Scott | H05B 6/08 |
| | | | 219/608 |
| 5,982,253 A * | 11/1999 | Perrin | H01R 13/719 |
| | | | 333/182 |
| 6,040,555 A | 3/2000 | Tiller | |
| 6,091,048 A * | 7/2000 | Lanouette | B23K 9/095 |
| | | | 219/130.21 |
| 6,096,994 A | 8/2000 | Handa | |
| 6,103,994 A | 8/2000 | Decoster | |
| 6,107,601 A * | 8/2000 | Shimogama | B23K 9/1037 |
| | | | 219/130.01 |
| 6,114,657 A | 9/2000 | Hayes | |
| 6,156,999 A | 12/2000 | Ignatchenko | |
| 6,166,506 A | 12/2000 | Pratt | |
| 6,169,278 B1 | 1/2001 | Sternowski | |
| 6,225,596 B1 | 5/2001 | Chandler | |
| 6,278,082 B1 * | 8/2001 | Shimogama | B23K 9/1274 |
| | | | 219/125.1 |
| 6,297,472 B1 | 10/2001 | Bong | |
| 6,359,258 B1 * | 3/2002 | Blankenship | B23K 9/10 |
| | | | 219/130.01 |
| 6,423,936 B1 | 7/2002 | Reed | |
| 6,458,157 B1 | 10/2002 | Suaning | |
| 6,466,609 B2 | 10/2002 | Koslar | |
| 6,479,791 B1 | 11/2002 | Kowaleski | |
| 6,479,795 B1 | 11/2002 | Albrecht | |
| 6,486,439 B1 * | 11/2002 | Spear | B23K 9/1062 |
| | | | 219/136 |
| 6,531,684 B2 * | 3/2003 | Rice | B23K 9/073 |
| | | | 219/130.21 |
| 6,570,132 B1 | 5/2003 | Brunner | |
| 6,603,221 B1 * | 8/2003 | Liu | H03K 17/725 |
| | | | 307/125 |
| 6,624,388 B1 | 9/2003 | Blankenship | |
| 6,627,849 B2 | 9/2003 | Ihde | |
| 6,653,597 B2 | 11/2003 | Baum | |
| 6,710,297 B1 * | 3/2004 | Artelsmair | B23K 9/1043 |
| | | | 219/130.01 |
| 6,781,095 B2 | 8/2004 | Hayes | |
| 6,818,860 B1 | 11/2004 | Stava | |
| 6,906,285 B2 * | 6/2005 | Zucker | B23K 9/124 |
| | | | 219/132 |
| 6,909,285 B2 | 6/2005 | Jordan | |
| 6,936,789 B2 | 8/2005 | Hanzel | |
| 6,974,931 B2 * | 12/2005 | Holverson | B23K 9/0282 |
| | | | 219/130.5 |
| 7,041,937 B2 * | 5/2006 | Ihde | B23K 9/173 |
| | | | 219/137.71 |
| 7,205,503 B2 | 4/2007 | Reynolds | |
| 7,400,687 B2 | 7/2008 | Matsumoto | |
| 8,345,819 B2 | 1/2013 | Mastronardi | |
| 2001/0043656 A1 | 11/2001 | Koslar | |
| 2002/0039388 A1 * | 4/2002 | Smart | H04L 5/0046 |
| | | | 375/260 |
| 2003/0089693 A1 | 5/2003 | Hayes | |
| 2004/0167001 A1 | 8/2004 | Hagihara | |
| 2004/0173591 A1 | 9/2004 | Knoener | |
| 2004/0199846 A1 | 10/2004 | Matsumoto | |

(56) References Cited

U.S. PATENT DOCUMENTS

| | | | |
|---|---|---|---|
| 2005/0016975 A1* | 1/2005 | Reynolds | B23K 9/1087 219/132 |
| 2005/0087523 A1 | 4/2005 | Zucker | |
| 2005/0199605 A1* | 9/2005 | Furman | B23K 9/095 219/132 |
| 2006/0027546 A1 | 2/2006 | Reynolds | |
| 2006/0076335 A1 | 4/2006 | Reynolds | |
| 2006/0086706 A1 | 4/2006 | Ulrich | |
| 2006/0138113 A1 | 6/2006 | Ott | |
| 2006/0262028 A1* | 11/2006 | Takei | H01Q 9/0442 343/850 |
| 2011/0073569 A1 | 3/2011 | Rappl | |

FOREIGN PATENT DOCUMENTS

| | | |
|---|---|---|
| JP | 61137675 | 6/1986 |
| JP | 162966 | 6/1992 |
| JP | 4162964 | 6/1992 |
| JP | 04162964 | 6/1992 |
| JP | 04162966 | 6/1992 |
| JP | H0616946 | 6/1992 |
| JP | 05104248 | 2/1993 |
| JP | 2003088957 | 3/2003 |
| JP | 2003154455 | 5/2003 |
| JP | 2003191075 | 7/2003 |
| JP | 2003236663 | 8/2003 |
| WO | 2011041037 | 4/2011 |
| WO | 2012058164 | 5/2012 |

OTHER PUBLICATIONS

International Search Report from PCT application No. PCT/US2013/043929 dated Oct. 22, 2013, 12 pgs.

* cited by examiner

SYSTEMS FOR IMPROVING SIGNAL QUALITY OF COMMAND/CONTROL SIGNALS TO BE TRANSMITTED OVER A WELD CABLE

CROSS-REFERENCE TO RELATED APPLICATIONS

The present application is a continuation of U.S. Ser. No. 11/609,871 filed Dec. 12, 2006, which is a continuation-in-part of U.S. Ser. No. 11/276,288 filed Feb. 22, 2006, which is a continuation-in-part of U.S. Ser. No. 10/709,148 filed Apr. 16, 2004, the disclosures of which are incorporated herein by reference.

BACKGROUND OF THE INVENTION

The present invention relates generally to high power systems utilizing a remote power source and, more particularly, to a method and apparatus of remotely controlling a power source designed to deliver power to a remote device. The invention further relates to a power source whose operation is governed by control signals received across a power cable connecting a remote device to the power source. The invention, while not so limited, is believed to be particularly applicable to welding, plasma cutting, and induction heating systems. One exemplary system to which the present invention is applicable is a Metal Inert Gas (MIG) welding system having a power source and a remote wire feeder.

MIG welding, formerly known as Gas Metal Arc Welding (GMAW), combines the techniques and advantages of Tungsten Inert Gas (TIG) welding's inert gas shielding with a continuous, consumable wire electrode. An electrical arc is created between the continuous, consumable wire electrode and a workpiece. As such, the consumable wire functions as the electrode in the weld circuit as well as the source of filler metal. MIG welding is a relatively simple process that allows an operator to concentrate on arc control. MIG welding may be used to weld most commercial metals and alloys including steel, aluminum, and stainless steel. Moreover, the travel speed and the deposition rates in MIG welding may be much higher than those typically associated with either TIG welding, formerly known as Gas Tungsten Arc Welding (GTAW), or Shielded Metal Arc Welding (SMAW) also known as stick welding, thereby making MIG welding a more efficient welding process. Additionally, by continuously feeding the consumable wire to the weld, electrode changing is minimized and as such, weld effects caused by interruptions in the welding process are reduced. The MIG welding process advantageously produces very little or no slag, the arc and weld pool are clearly visible during welding, and post-weld clean-up is typically minimal, relative to other welding techniques. Another advantage of MIG welding is that it can be done in most positions which can be an asset for manufacturing and repair work where vertical or overhead welding may be required.

In common MIG systems, a wire feeder is operationally connected to the power source and designed to deliver consumable wire to a weld. To further enhance the operability of the wire feeder of a MIG welding system, known welding systems have connected the power source and the wire feeder to one another across a dedicated control cable that is in addition to a dedicated power or weld cable. Control signals defining the operational parameters of the power source are transmitted or fed back from the wire feeder to the power source. This is generally referred to as remote control to the power source.

One type of remote control device is used to regulate the operational welding parameters, and switch the welding power source output ON and OFF as well as change the power source state via a pendant that connects to the power source by a multi-conductor cable. This solution is schematically illustrated in FIG. 1A. A wire feeder 2A is connected to a remote power source 4A by a control cable 6A that includes a 14-pin connector (not shown). The cable 6A is used to transmit operational information to, and in some cases, from the power source, and may incorporate two to fourteen conductors depending on the number of functions that are to be controlled. Separately connected between the power source 4A and wire feeder 2A is a high-current/high-voltage weld cable 8A that delivers welding power to the wire feeder and creates a voltage potential between an electrode and a workpiece that is exploited to create and maintain an arc between the electrode and workpiece during welding.

A significant drawback to this cable-based control is that the control cable is typically fragile relative to the welding cables designed to carry high currents at high voltages. Welding machines are commonly used at construction sites or shipyards where it is not uncommon for the welding machines to be periodically relocated or surrounded by other mobile heavy equipment operating in the same area. As such, the remote control cable can become damaged by being crushed or snagged from contact with surrounding machines and/or traffic. This can cause damage to the wire feeder and/or the welding power source if internal power conductors become shorted to signal leads that are connected to sensitive signal level circuitry.

Another known system is a voltage following or voltage sensing wire feeder having an internal contactor. This solution is schematically shown in FIG. 1B. As shown, this system includes a wire feeder 2B that receives its electrical power from the voltage present in the welding circuit. The wire feeder is connected to a remote power source 4B via a weld cable 8B. One disadvantage of this system is that the operator has no convenient way to adjust the output of the welding power source to compensate for changes in workpiece thickness and/or fit up. The operator may call another person more conveniently located to the power source with a radio or some other means of communication to make the adjustment; however, if the operator is working alone, s/he must return to the power source to make the necessary adjustments. Another disadvantage of this system is that it requires the presence of a high current DC contactor to de-energize the welding circuit at the wire feeder. These contactors are large, heavy, costly, and require periodic maintenance to ensure proper and continual operation. The location of the secondary contactor in the remotely located wire feeder also requires that the welding circuit from the welding power source to the wire feeder remain energized even when not welding so that power is available to the wire feeder and welding arc when the gun trigger is activated. Accordingly, an open circuit voltage at or near a weld potential remains present across the weld cables. The weld cables, however, can become damaged at a worksite resulting in an unwanted arc being formed between an exposed portion of the cable and an unexpectant ground.

Another remote control solution is described in U.S. Ser. No. 10/604,482, which is assigned to the Assignee of the present application. Notwithstanding the numerous advancements achieved with the invention of the aforementioned pending application, such a system relies upon pulse width modulation to remotely transmit operational data from a wire feeder to a power source across a weld cable. By using pulse width modulated signals to remotely control operation of a power source, the amount of data as well as variability in the types of data that could be transmitted between the wire feeder and a power source is limited. Further, with the system described in the aforementioned pending application, the wire feeder requires an internal DC power supply to power the electronics of the wire feeder. That is, the invention of the above-referenced application teaches the avoidance of an open circuit voltage between the wire feeder and power source. As a result, absent a DC power supply, the wire feeder cannot be minimally powered so as to communicate with the power source to initiate the welding process.

It is therefore desirable to design a welding system incorporating a communications network or link for communication of control command signals from a wire feeder across a weld cable to control or otherwise regulate operation of a remote power source. It would also be desirable to design a remote controlled welding system without needing a dedicated DC power supply disposed in a wire feeder. It would be further desirable to design a wire feeder that receives a low voltage DC input to maintain powering of wire feeder electronics when the wire feeder is in a non-welding, standby state via only the weld cable connections.

BRIEF DESCRIPTION OF THE INVENTION

The present invention is directed to a remotely controlled welding machine that overcomes the aforementioned drawbacks. A remote control uses phase shift keyed (PSK) modulation to transfer control commands to a welding power source across a weld cable. The information to be communicated to the power source may include welding power source output command information (amperage/voltage control), welding circuit ON/OFF information (power source output contactor control), and power source state control (constant voltage/constant current). A transceiver transmits the control commands of desired welding operational parameters to the power source across a weld cable also designed to carry welding power from the power source to the wire feeder.

Therefore, in accordance with one aspect of the present invention, a welding-type system includes a power source which delivers power for a welding-type process at its terminal. The system also includes a remote device which receives power from the power source via a cable connected at the power source's terminal. The remote device has a transmission assembly that is configured to encode control commands onto a carrier wave using phase shift keying and then transmit the encoded control commands across the cable to a receiver of the power source. The receiver is configured to receive and decode the encoded control commands from the cable. The system further includes at least one circuit that is connected to the cable and configured to improve signal quality for the encoded control commands transmitted thereacross.

According to another alternative aspect of the present invention, a method for manufacturing a remotely controllable welding-type system includes providing a power source that is capable of selectively supplying welding power or standby power, operably connecting a remote device that has operator controls to the weld cable of the power source, and configuring the remote device to communicate to the power source over the weld cable via a transmission protocol (whether the power source is supplying the weld power or the standby power). The method also includes improving transmission quality over the weld cable by filtering high frequency noise thereon, increasing impedance at the terminations of the weld cable, or both.

In accordance with yet another aspect of the present invention, the communication assembly for a welding-type system has a transmitter connected to a remote device of the system. The transmitter is configured to transmit control commands over the weld cable of the system. A receiver is connected at the other end of the weld cable to the power source and is configured to receive the control commands from the transmitter. The power source also includes a controller that adjusts the power source's output according to the control commands received by the receiver. To improve signal quality of the transmitted selections, the communication assembly also includes a signal-to-noise ratio coupling circuit which is connected to the output terminals of the power source, an input of the receiver, or both.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention will be described with respect to regulation of a power source and a wire feeder of a MIG welding system based on modulated feedback provided from a transceiver remote from the power source to a receiver incorporated within the power source. However, the present invention is equivalently applicable with regulating power sources of TIG, stick, flux cored, and the like welding systems. Moreover, the present invention is also applicable with non-welding, high power systems such as plasma cutters and induction heaters.

Figure 1A:
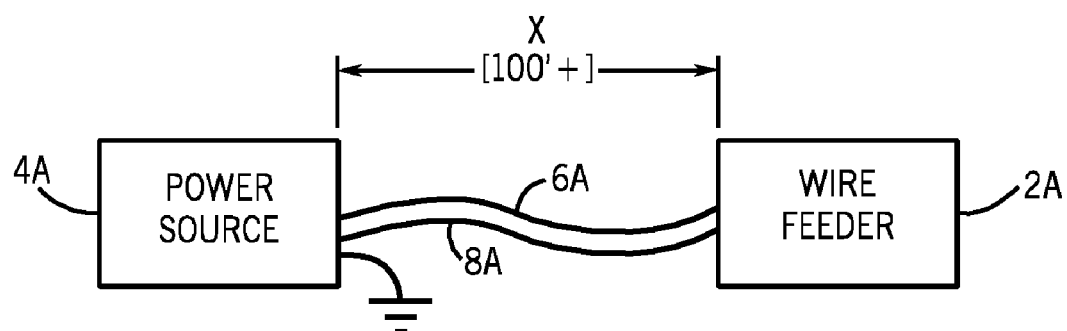
FIGS. 1A-1B are schematic block diagrams illustrating examples of known remotely controlled welding and wire feeder systems.
Figure 1B:
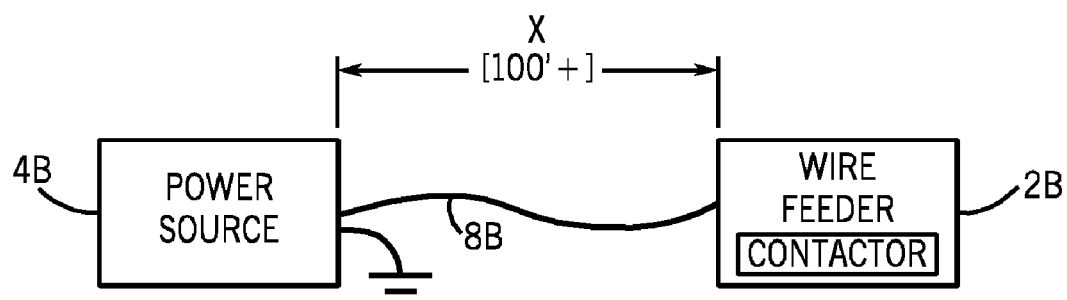
Figure 2:
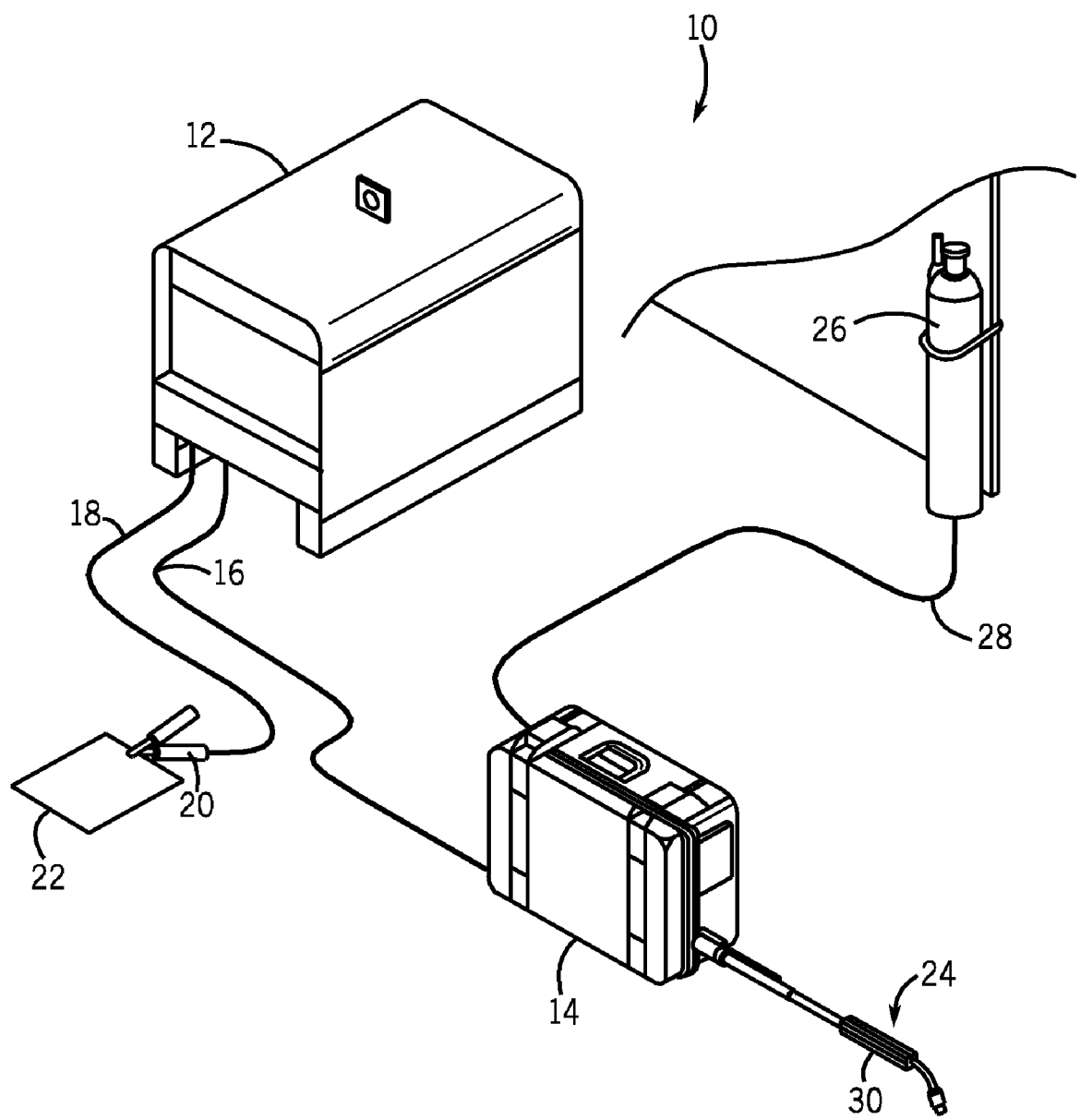
FIG. 2 is a pictorial view of a welding system in accordance with one aspect of the present invention.

Referring to FIG. 2, an exemplary MIG welding system 10 includes a welding power source 12 designed to supply power to a wire feeder 14 through a weld cable 16. The power source is designed to run in one of a number of modes including constant voltage (CV) and constant current (CC). Also connected to the power source is a secondary work weld cable 18 that connects the power source to a clamp 20, which holds cable 18 to workpiece 22. Also connected to wire feeder 14 is a welding gun or torch 24 configured to supply consumable welding wire fed thereto by a feed motor (not shown) to a weld. Welding system 10 may further include a gas cylinder 26 connected to wire feeder 14 such that shielding gas can be provided through gas hose 28 for the MIG welding process.

Power source 12 is designed to condition raw power supplied from a utility line or engine driven power supply and output power usable by the welding process. As such, power source 12 includes one or more transformer assemblies (not shown) to condition the raw power. The output of the power source is generally controlled by a controller and associated operational circuitry that regulates the output of the power conditioning components. As such, the power source may be initially powered but not provide a welding output until the power circuit is energized through the closing of a high current DC contactor or other switching assembly. As will be described in greater detail below, power source 12 is regulated such that a welding power output is not provided until gun 24 is activated signaling commencement of the welding process. In this regard, a welding circuit is not created between power source 12 and workpiece 22 until gun 24 is activated, by depressing gun trigger 30, for example, and is placed in relative proximity with workpiece 22.

As shown, a separate control cord connecting the wire feeder and power source to one another is avoided. Further, wire feeder 14 is preferably constructed without a contactor assembly to close the welding circuit. That is, the power necessary for the wire feeder 14 to supply wire to the weld is not always present across weld cables 16 and 18. Accordingly, a separate contactor or switch assembly is not needed in wire feeder 14 to close the welding circuit. The customary open circuit voltage between a power source and a wire feeder is then eliminated because a communications controller within the wire feeder causes transmission of command signals through weld cables 16 and 18 to a communications controller disposed within the power source that is designed to communicate with a power source controller such that welding power is not provided until the command signal is received from the wire feeder.

Figure 3:
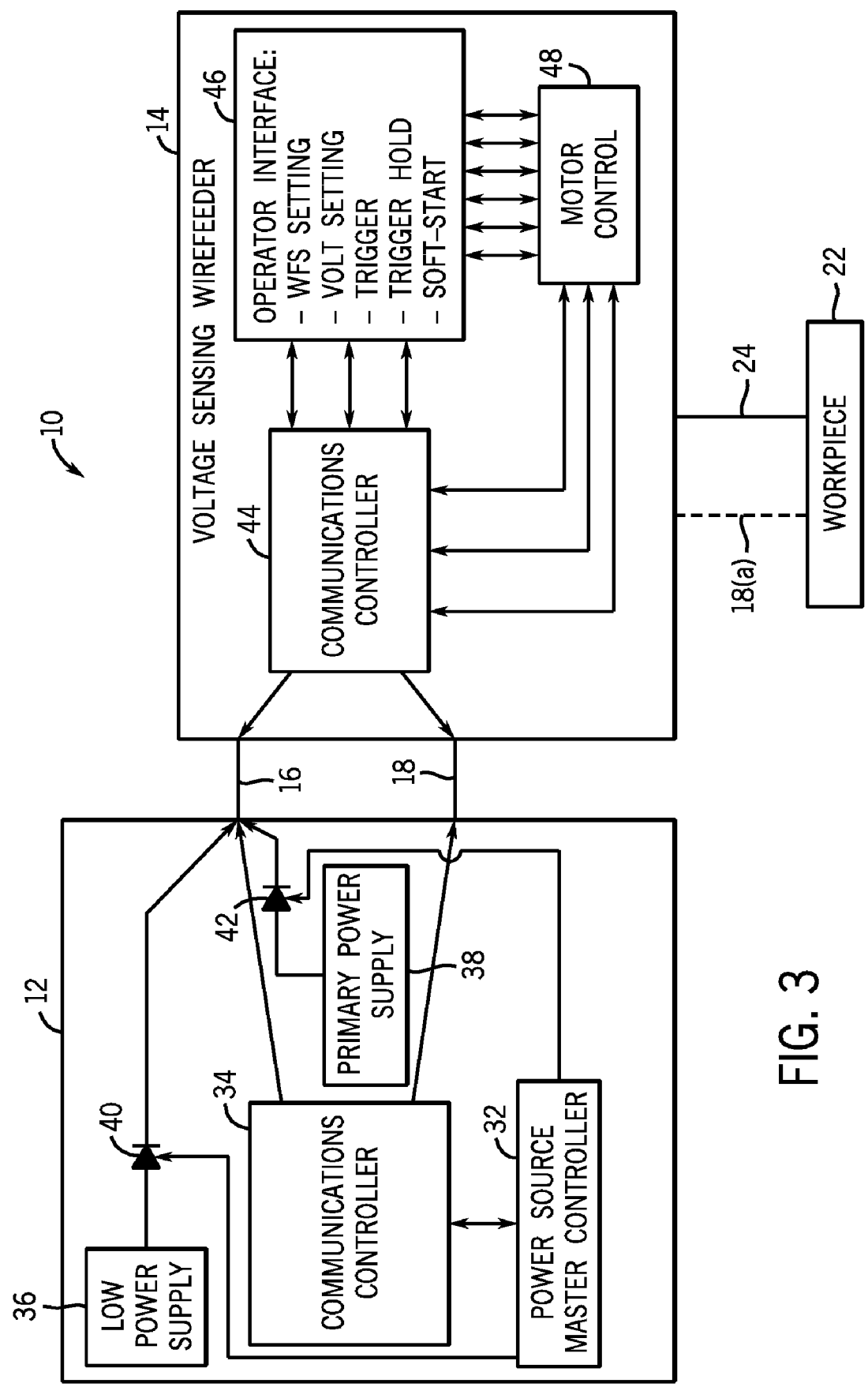
FIG. 3 is a schematic of the welding system illustrated in FIG. 2.

Referring now to FIG. 3, the exemplary welding system of FIG. 2 is schematically shown. Welding system 10 includes power source 12 that is designed to deliver power to voltage sensing wire feeder 14. A welding circuit is formed between the power source and the wire feeder across weld cables 16 and 18 that effectively form a welding circuit. In the schematic illustrated in FIG. 3, weld or ground cable 18 is shown connected to wire feeder 14 and, as a result, the wire feeder would include a weld cable 18(*a*) connected to the workpiece 22. However, one skilled in the art will appreciate that cable 18 may be directly connected to the workpiece and, as such, cable 18(*a*) would be a voltage sensing lead that would also be connected to the workpiece to provide voltage feedback to the wire feeder 14.

Power source 12 includes a master controller 32 designed to regulate operation of the electronic components of the power source. In addition to the master controller 32, the power source is also equipped with a communications controller 34. The communications controller is preferably a LonWorks® PLT-22 Powerline Smart Transceiver, commercially available from Echelon Corporation of San Jose, Calif. LONWORKS is a registered trademark of Echelon Corporation of San Jose, Calif. While it is contemplated that a number of communications controllers may be used, it is preferred that the power source have a LonWorks® PLT22 Powerline Smart Transceiver, that communicates using the LonTalk® communication language. LONTALK is also a registered trademark of Echelon Corporation.

The LonTalk® communication language and the LonWorks® communications controller are a preferred protocol and component, respectively, because the protocol allows the transmission and reception of command signals from other devices in a communications network without needing to know the topology of the network or the names, addresses, or functions of the other devices. The LonWorks® communications controller can also provide signal acknowledgement, signal authentication, and priority delivery.

As will be described more fully below, the power source 12 also includes a low voltage or secondary supply 36 to provide a low, non-welding voltage across the weld cables 16, 18 when the power source is in a non-welding, stand-by state. The power source 12 also has a primary power supply 38, which comprises a transformer (not shown) and other electronics to condition a raw power input into a form usable for a welding process. The low power supply 36 and primary power supply 38 are each controlled by the master controller 32. Each power supply 36, 38 is connected to a switch or diode 40, 42, respectively, that is selectively biased to control the power signal present across the weld cables 16, 18. The primary power supply 38 supplies a welding power at a desired voltage and current to the wire feeder across the weld cables.

The voltage sensing wire feeder 14, like the power source 12, has a communications controller 44. The communications controller is preferably a LonWorks® PLT22 Powerline Smart Transceiver, that communicates with the communications controller of the power source using the LonTalk® protocol. It is contemplated that other communications controllers and communication protocols can be used; however, the communication controllers of the power source and wire feeder should be compatible.

The wire feeder communications controller 44 communicates with the wire feeder's user or operator interface 46 and motor controller 48. The operator interface 46 allows the operator to indicate desired operational parameters including, but not limited to wire feed speed and arc voltage. Generally, a signal indicating the desired wire feed speed is translated to the motor control 48 so that consumable wire is fed to the welding gun or torch at the desired feed rate. A signal indicating the desired arc voltage is fed to the communications controller 44.

The communications controller 44, as will be described below, causes transmission of a message to the power source communication controller 34 across the weld cables. Once received, the power source controller 34 sends a message to the power source master controller 32 of the user-desired arc voltage. The master controller 32 then controls the primary power supply to provide power at the desired voltage across the weld cables.

In addition to receiving a signal when a user provides an operational parameter input, the communications controller 44 is also designed to transmit trigger information to the power source. That is, when the trigger is depressed, the communications controller 44 causes transmission of a welding-commencement signal to the power source communications controller 34. This commencement signal, when received, instructs the power source to provide a welding or primary power. Similarly, when the trigger is released, a welding-termination signal is transmitted across the weld cable and causes the power source to terminate delivery of a welding power and go to a stand-by state. In the stand-by state, it is envisioned that the power source could either provide no power across the weld cables or could provide a non-welding, secondary power that is insufficient for welding, but could be used to power the electronics in the wire feeder.

The above welding system construction has a number of advantages. First, the wire feeder 14 is designed to be a portable or "suitcase" wire feeder such that reduction in weight is clearly advantageous. As such, constructing wire feeder 14 to operate without a separate contactor assembly reduces the overall weight and size of the wire feeder. Furthermore, the contactors required for high current DC applications can be quite expensive thereby increasing the overall cost of the wire feeder. Additionally, the contactor assembly is a maintenance item that may require routine maintenance for continued proper operation. Therefore, constructing wire feeder 14 without such a contactor assembly has a number of size- and cost-associated advantages.

Second, formation of a communications link between power source 12 and wire feeder 14 directly through weld cables 16 and 18 eliminates the need for a separate control/power cable. The control cable adds to the complexity, weight, and overall cost of the welding system. Additionally, as previously noted, the control cord is typically less durable than the welding cables and, as such, is prone to nicks and snags typically associated with industrial locations. Moreover, incorporating the wire feeder without a separate contactor improves the overall current capacity of the wire feeder. That is, the rating of the contactor assembly within the wire feeder generally dictates the ampacity loads of the wire feeder. Removal of the contactor assembly thereby allows the ampacity loads to be governed by other components of the wire feeder which typically have greater maximum ampacity loads than the contactor assembly.

Figure 4:
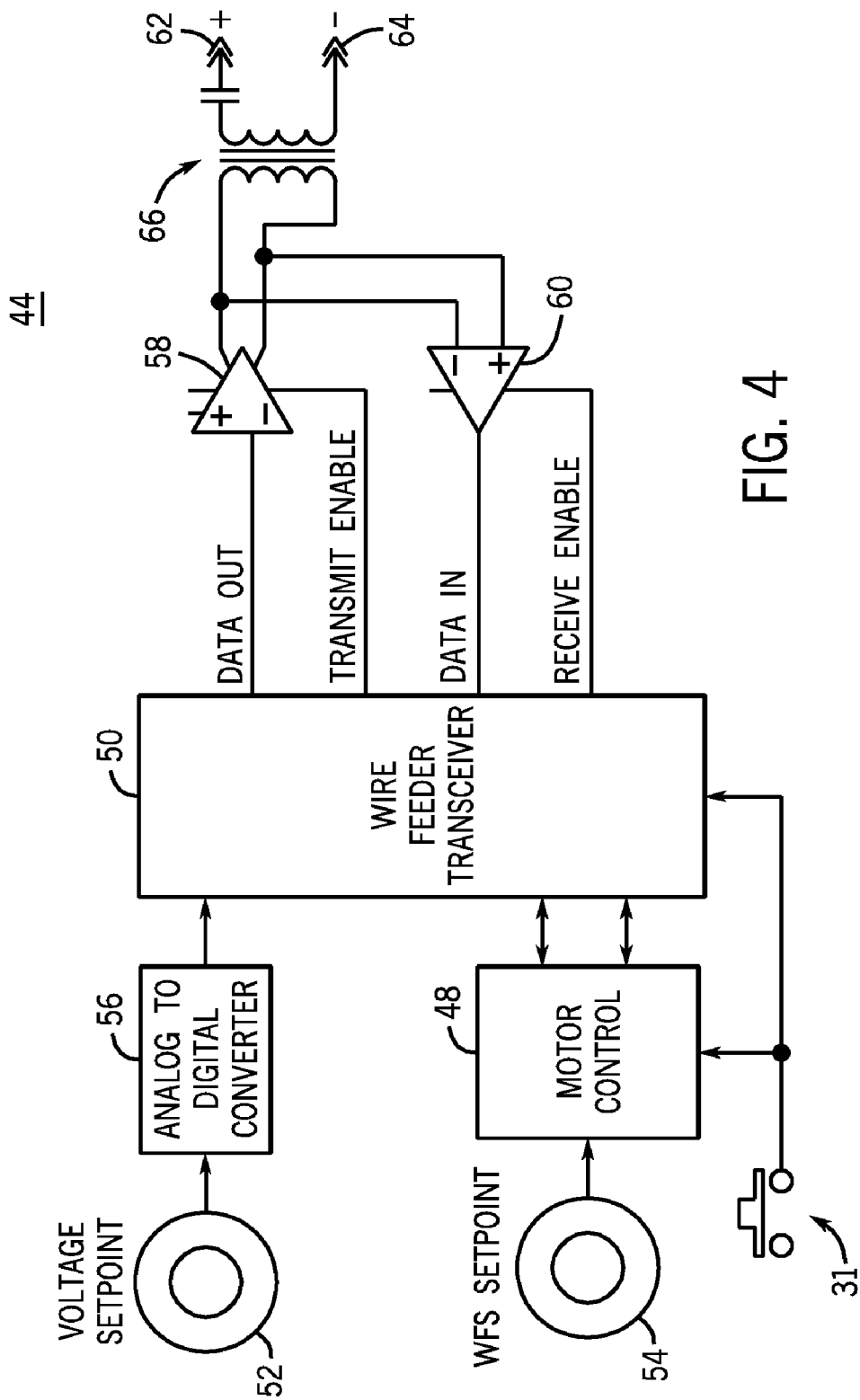
FIG. 4 is a schematic of the wire feeder communications circuit illustrated in FIG. 2.

Referring now to FIG. 4, a block diagram illustrates an exemplary configuration of the wire feeder communications controller and its associated inputs/outputs. As illustrated, the controller includes a power-line transceiver 50 that is designed to transmit and receive operational data. The transceiver receives operational set-point data from the operator interface, such an arc voltage control knob 52 and a wire feed speed control knob 54. It is understood that additional or different operational input devices may be used and connected to the power-line transceiver 50. Additionally, it is contemplated that the user interface (or portions thereof) may be integrated with the gun or torch to allow user control of the welding process without leaving the weld.

Connected between the arc voltage set-point knob 52 and the transceiver 50 is an analog-to-digital converter 56 that converts the analog output of control knob 52 to a digital input for the transceiver.

An input to the wire feed speed control knob is communicated to the wire feed speed motor controller 48 and then communicated to the transceiver 50. It is contemplated that communication between the motor controller 48 and the transceiver is bi-directional. Additionally, the motor controller 48 and the transceiver 50 are operably connected to detect activation of trigger of the welding gun or torch. It is contemplated that a number of sensor devices and techniques may be used to detect activation of the trigger, e.g., an infrared sensor (not shown) in proximity to the trigger or a contact switch 31.

Transceiver 50 transmits operational parameter data in the form of a command signal to the power source that embodies the user-desired inputs to control knobs 52, 54 as well as trigger status. The command signal is preferably encapsulated in a defined protocol, such as the LonTalk® protocol, and encoded with a narrow-band binary phase shift keying (BPSK) modulation scheme, but it is contemplated that other modulating protocols may be used, such as quadrature phase shift keying (QPSK). In a further preferred embodiment, narrow-band binary PSK is used to modulate the command signal for transmission to the power source across the weld cable.

Controller 44 also includes a pair of amplifiers 58, 60 connected to the transceiver 50. Amplifier 58 facilitates the transmission of data out of the transceiver when properly enabled and amplifier 60 facilitates the reception of data for subsequent inputting to the transceiver when properly enabled. Both amplifiers are connected to the weld cables 16, 18 via corresponding weld terminals 62, 64 by coupling transformer 66. The coupling transformer 66 provides galvanic isolation to the weld voltage potential and provides a voltage level translation for translating the control command signal to a level compatible with the weld cables. It is also recognized that the coupling transformer advantageously provides impedance matching. In a preferred embodiment, to be further described with reference to FIG. 7, an improved signal-to-noise ratio (SNR) can be achieved by additionally coupling resonant circuits at the terminations of weld cable 16 and attenuating high frequency noise across the weld terminals of the power source (not shown).

Figure 5:
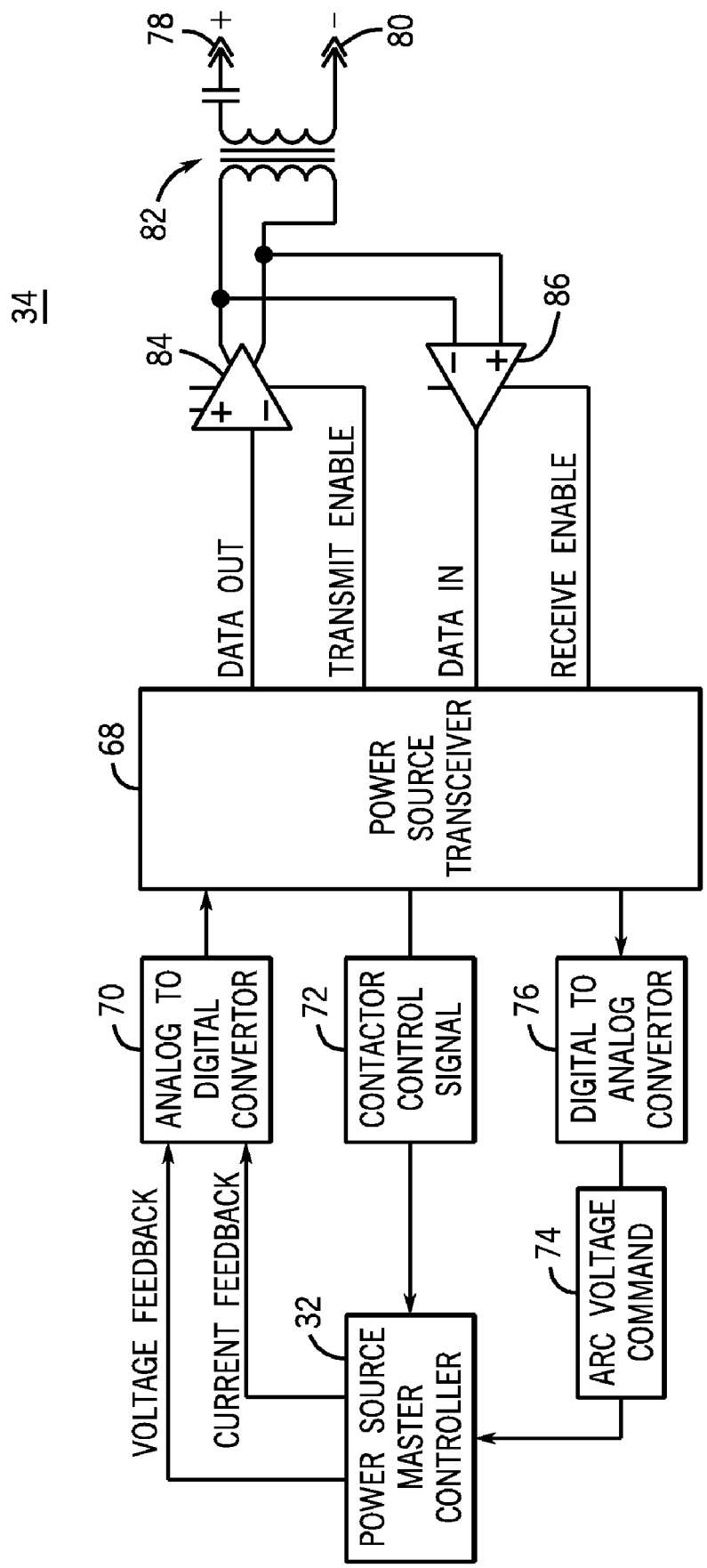
FIG. 5 is a schematic diagram of the power source communications circuit illustrated in FIG. 3.

Referring now to FIG. 5, a block diagram illustrates an exemplary configuration of the power source communications controller and its associated inputs/outputs. The power source communications controller, the welding circuit, and the wire feeder communications controller effectively form a communications link. Like the wire feeder controller, the power source controller 34 has a power-line transceiver 68 to facilitate communication between the power source and the wire feeder. Transceiver 68 is connected to receive voltage and current feedback from the power source master controller through analog-to-digital converter 70. In this regard, the master controller, which controls operation of the power delivery components of the wire feeder, provides feedback as the voltage and current levels the power components are being driven to the transceiver, which can be subsequently transmitted to the wire feeder. Accordingly, the master controller (not shown) of the wire feeder, which includes voltage and/or current sensors (not shown) may compare the commanded voltage and/or current levels to sensed voltage and/or current levels to determine if the system is operating properly and, if not, provide an alert to the user.

As referenced above, in addition to operational parameter data, it is envisioned that the wire feeder also provide a trigger status signal to the power source. As such, transceiver also provides a contactor control message output 72 to the master controller 32. The contactor control message allows the master controller to selectively open/close the primary contactor (generally shown as diode 42 in FIG. 3) in the power source. The primary contactor is used to control the application of welding power between the power source and the wire feeder. Accordingly, when the power or primary contactor is open, welding power cannot be delivered to the wire feeder from the power source. When closed, welding power can be delivered.

It is contemplated, however, that the power source may include a primary as well as a secondary contactor (generally shown as diode 40 in FIG. 3). The secondary contactor, when closed, closes a secondary power circuit between the power source and the wire feeder across the weld cables. This secondary power circuit can be used to supply a non-welding power between the power source and the wire feeder. The primary contactor is generally large and costly, therefore, it is envisioned that the secondary contactor could be much smaller than the primary contactor. By utilizing a secondary contactor in addition to the primary contactor, the power source can supply sufficient power to the wire feeder for the wire feeder electronics without the need for a large open circuit voltage between the power source and wire feeder, or a battery in the wire feeder to power the wire feeder electronics.

In addition to providing a contactor control message 72 to the master controller 32, it is contemplated that the transceiver communicate an arc voltage command signal 74 to the master controller 32 through digital-to-analog converter 76.

Similar to the transceiver of the wire feeder, transceiver 68 is also connected to weld terminals 78, 80 via coupling transformer 82 and amplifiers 84, 86. Coupling transformer provides similar functionality as the coupling transformer 66 in the wire feeder 14. Amplifier 84, when enabled, supports the transmission of data from the power source to the wire feeder across the weld cables. Amplifier 86, when enabled, facilitates the reception of data from the wire feeder across the weld cables.

In a preferred embodiment, the control command messages are encapsulated in the LonTalk® protocol and encoded with a BPSK modulation scheme and transmitted over the weld circuit using dual carriers to provide a robust communications link between the power source and the wire feeder. That is, communication between the power source and the wire feeder is through narrow-band binary PSK digital modulation in the CENELEC A and CENELEC C bands of operation. As described with respect to FIG. 6, the communications between the power source and the wire feeder include a verification/acknowledgement feature to add to the robustness of the communications link.

Figure 7:
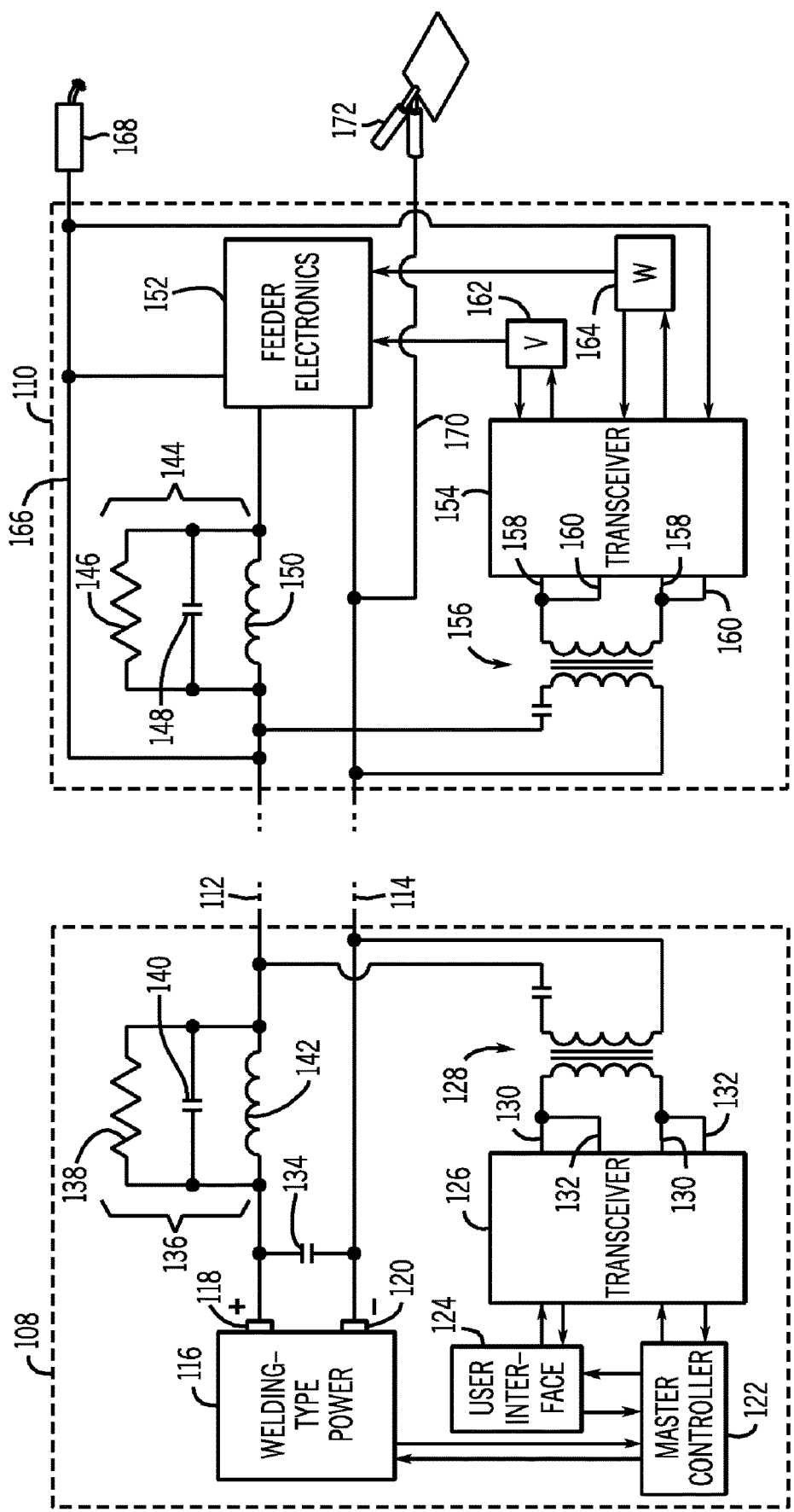
FIG. 7 is a schematic diagram of a wire feeder incorporating the communications circuit of FIG. 4 and a power source incorporating the communications circuit of FIG. 5, with improved SNR coupling.

Referring now to FIG. 7, a schematic diagram of a wire feeder and a power source incorporating a transmission assembly of the present invention is shown. Power source 108 is operably connected to wire feeder 110 via weld cables 112 and 114 to deliver welding power thereto. In accordance with embodiments described herein, power source 108 may also provide secondary or standby power to wire feeder 110. That is, either power circuit 116 may be configured to provide two outputs or a secondary power supply may be included to provide a second output of power source 108. In either case, power from the power source 108 is supplied at terminals 118, 120 to which cables 112, 114 are connected. As in the embodiment shown in FIG. 5, power source 108 is equipped with a master controller 122 to control the welding parameters and outputs of power source 108. Optionally, a user interface 124 may be included so that operators can control power source outputs and modes, wire feed, and other welding parameters from the power source. User interface 124 may take the form of knobs, switches, buttons, or more advanced controls such as LCD or touch screen displays.

Additionally, power source 108 includes a transceiver 126 for communication across cables 112, 114 with wire feeder 110. As shown, transceiver 126 comprises a pair of inputs 130 for receiving data and a pair of outputs 132 for transmitting data. Transmitted data may include control commands from the user interface 124 or master controller 122. However, minimally, transceiver 126 may be a receiver having only inputs 130. Transceiver 126 is connected to weld cables 112, 114 via a coupling transformer 128.

As described above, transceiver 126 operates to receive data by decoding control signals and commands encoded on a carrier wave at a given frequency applied across either or both of weld cables 112, 114 by wire feeder 110. Transceiver 126 may also transmit information by encoding it onto a carrier wave of a corresponding frequency and applying the encoded carrier wave across either or both of weld cables 112, 114. Thus, operators may set wire feed settings and other control parameters for wire feeder 110 via user interface 124. Master controller 122 receives the settings from the user interface 124 and converts them to encodable commands for transmission via the protocol of transceiver 126.

To improve the quality of signal transmission over weld cables 112, 114, a circuit may preferably be electrically connected with weld cables 112, 114 to improve SNR and/or increase impedance at a frequency of interest (preferably corresponding to the carrier frequency of the transceiver 126). As is well known in the art, the cables of high power systems exhibit high frequency noise when conducting power to a load. This noise can be extremely distortive of data signals transmitted across the cables, significantly lowering SNR. One manner of reducing such noise and thereby improving SNR is to include a low-pass filter 134 across the terminals 118, 120 of the high power system. In essence, a capacitor 134 can act as a low-pass filter, removing noise in the appropriate band by attenuating frequencies higher than the frequency of interest. The frequency at which the filter begins attenuating or blocking noise may be any desired frequency higher than the frequency of interest, and may be within a variety of ranges from the frequency of interest depending upon the bands of noise generated by the power source. One of skill in the art will also appreciate that many types of low-pass filters may be utilized to reduce or eliminate noise, including both passive and active filters, such as op-amp filters, transistor based filters, and the like.

In addition, those skilled in the art will recognize that the output terminals 118, 120 of the power source 108 create low-impedance terminations on weld cables 112, 114 which may cause significant injection loss and result in poor signal quality. This phenomenon may actually be accentuated by the inclusion of some types of low-pass filters at the outputs 118, 120 of the power source 108. One method of increasing impedance at the terminations of weld cables 112, 114 for the transmission frequency is to include a resonant circuit 136 on weld cables 112, 114 near the terminals 118, 120 of power source 108, as shown. In one embodiment, resonant circuit 136 of power source 108 may be an LC tank circuit. The inductive 142 and capacitive 140 components determine the frequency at which the resonant circuit 136 will resonate, with the resistive component 138 adding the peak impedance. Therefore, by proper selection of these components, the peak impedance of the resonant circuit 136 may be set at the transmission frequency of transceiver 126, and injection loss is accordingly reduced.

In further embodiments, transceiver 126 is configured to transmit control information on a first frequency, and if no response is received from wire feeder 110, the transceiver 126 automatically or selectively re-transmits the information at a second frequency. Thus, it may be desirable to simply set the peak impedance of resonant circuit 136 at an average frequency of the frequencies at which transceiver 126 transmits. An alternative to incorporating such a resonant circuit would be to include two resonant circuits, each having a peak impedance at a transmission frequency of transceiver 126. However, resonant circuit 136 may also be adaptable to set a peak impedance at multiple frequencies to match the frequency at which transceiver 126 (or transceiver 154 of wire feeder 110) is transmitting. For example, resonant circuit 126 may be comprised of two or more resonant circuits corresponding to frequencies of transmission which are switched or otherwise selectively applied on weld cables 112, 114 by a controller of transceiver 126 or transceiver 154. Alternatively, the capacitive 140, inductive 142, and/or resistive 138 components of resonant circuit 136 could be variable components such that one resonant circuit 136 could achieve peak impedances at multiple frequencies.

Similar to power source 108, wire feeder 110 also includes a power line transceiver 154 having input 158 and output 160 lines coupled to weld cables 112, 114 via a coupling transformer 156. It is recognized, however, that transceiver 154 may be merely a transmitter for uni-directional communication with power source 108. As described above, communication between power source 108 and wire feeder 110 is achieved by transmission of PSK encoded signals over weld cables 112, 114. Preferably, the signals are transmitted via a protocol particularly suitable for power line transmissions, such as the LonTalk® protocol. Signals transmitted from transceiver 154 to power source 108 may include control commands such as voltage and current settings, output modes, trigger signals, ON-OFF commands, and wire feed settings.

To improve signal quality of both transmitted and received control commands, a resonant circuit 144 is connected on weld cable 112 to provide an increased impedance at its termination. The frequency at which the peak impedance is provided depends upon the selection of the capacitive 148 and inductive 150 components of resonant circuit 144. Also, to accommodate varying transmission or carrier frequencies of transceiver 154, resonant circuit 144 may provide peak impedance at an average frequency, at two or more frequencies, or at variable frequencies, as described above.

In the embodiment depicted, a voltage setting control 162 and a wire feed control 164 provide control signals and settings which are communicated either to transceiver 154 to be transmitted to power source 108 or to feeder electronics 152, such as the wire feed motor (not shown). Voltage setting control 162 and wire feed control 164 are shown as bi-directionally connected to transceiver 154 so that control commands from user interface 124 of power source 108 may be communicated thereto. Thus, when an operator selects a power output or mode for the power source 108 via controls 162, 164, the selection is converted to a control command, encoded on a carrier frequency, received by transceiver 126 of power source 108, processed by master controller 122, and power source 108 will accordingly provide the selected output (i.e. welding-power, standby power, no power, voltage/current control, constant current, constant voltage, etc). Similarly, whether received from power source 108 or directly from a user operating controls 162, 164, the wire feeder electronics 152, including such components as a motor speed control, wire sensors, and wire feed rollers, operate under parameters set by the voltage control 162 and wire feed control 164.

As shown, weld cable 112 provides power directly to a torch 168 via power line 166 and weld cable 114 is attached directly to a workpiece 172 via line 170. Weld cables 112, 114 also provide power to the feeder electronics 152, through the resonant circuit 144. In some preferred embodiments, torch 168 includes a trigger sensor (not shown) that is connected to transceiver 154 to provide trigger signal feedback over weld cables 112, 114. Therefore, power source 108 may be switched from a standby or OFF state to an ON or welding-power state simply by engagement of torch 168.

Figure 6:
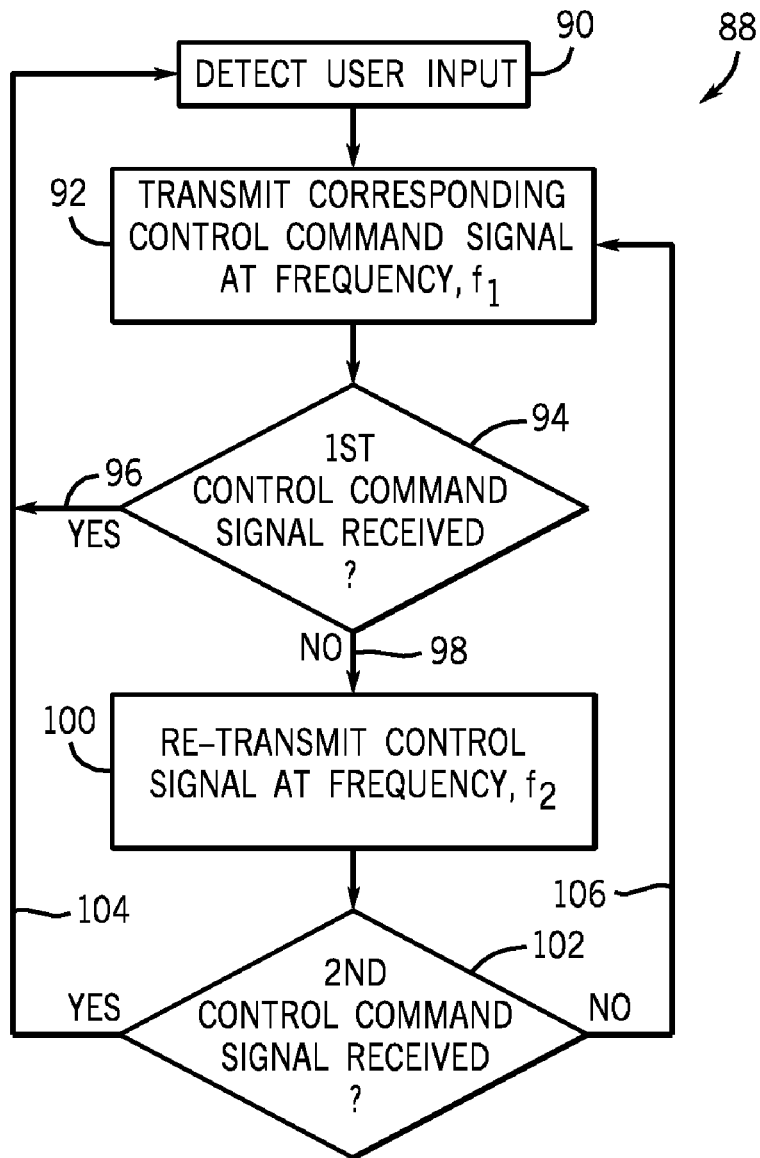
FIG. 6 is a flow chart setting forth the steps of remotely controlling a power source according to another aspect of the present invention.

Referring now to FIG. 6, a flow chart setting forth the steps of remotely controlling a power source according to another aspect of the present invention is shown. The process 88 begins at 90 with detection of a user input to one of number of operator parameter input devices, such as control knobs 52 and 54 or trigger switch 30. Software of the transceiver in the wire feeder associates this user input with a network variable. As a result, a change to the parameter input device results in a change to the network variable. Using the desired protocol, such as the LonTalk® protocol, this new network variable in the form of a control command signal containing corresponding operation control data is transmitted 92 to the power source across the welding circuit. As described above, the protocol layers including the network variable data, i.e., the operation control data, is encoded with a BPSK modulation scheme for transmission over the weld cables. The transceiver of the wire feeder then awaits an acknowledgement signal from the transceiver of the power source to confirm that the control command signal transmitted at 92 was properly received. As such, process proceeds to decision block 94.

If the control command signal was received and an acknowledgement was received by the wire feeder 94, 96, the process loops back to step 90 and waits for the next user input. However, if the transmitted control command signal was not properly received, e.g., the power source transceiver transmits an error signal, or if no acknowledgement signal is received by the wire feeder transceiver 94, 98, the control command signal is re-transmitted at 100. While the re-transmission may be at the same frequency as the original transmission, it is preferred that the re-transmission be at a different frequency than the original transmission. For example, in one preferred embodiment, the original transmission is at or near 128 kHz and the re-transmission is at or near 141 kHz.

Following re-transmission of the control command signal 100, the process proceeds to step 102 and determines if the re-transmission was received and acknowledged at 102 in a manner similar to the verification carried out at step 94. If the re-transmission was received and verified 102, 104, the process returns to step 90 and awaits a user input to one of the number of parameter input devices. However, if the re-transmission was either not received or not verified 102, 106, the process, in one preferred embodiment, returns to step 92 with the re-transmission of the control command signal at the original frequency. Thereafter, the process re-loops until the control command signal is received and verified.

It is contemplated that rather than re-transmit the control command signal at the original frequency, re-transmission could be at another, third (fourth, fifth, sixth, etc.) frequency. In this regard, the command signal is re-transmitted and cycled through multiple frequencies until it is received and verified. Moreover, it is contemplated, whether two or more transmission frequencies are used, that a fixed number of transmissions be attempted before the communications controller provides an error message to the user. It is contemplated that the error could take the form of an audio and/or visual signal as well as cause the wire feeder to go to or remain in a stand-by state.

The present invention supports bi-directional acknowledged communication between the wire feeder and the power source. In this regard, the power source transmits data to the wire feeder and the wire feeder transmits data to the power source. This data may be operational data or signal acknowledgement data. In any event, it is preferred that the flow chart steps described with respect to FIG. 6 be carried out by each communications controllers when that controller is transmitting operational control commands. Thus, the power source communications controller performs process 88 when communicating operational control data to the wire feeder and the wire feeder communications controller performs process 88 when communicating operational control data to the power source.

While bi-directional communication is preferred, it is contemplated that the wire feeder may be equipped with a transmitter and the power source with a receiver to support uni-directional communication between the two components.

As described above, the control command signal includes information regarding desired operational parameters of the wire feeder and instructs the master controller of the power source to set the magnitude of the output of the welding power source (volts or amperes), the mode of the welding power source (CC or CV), and wire feed speed among other parameters. The wire feeder transceiver is also configured to transmit commands regarding JOG and PURGE functions. That is, when the JOG button is pushed on the wire feeder, the transceiver automatically repeats the minimum reference command each time the open circuit voltage of the welding power source falls to zero.

While the communications controllers for the power source and wire feeder have been described as being internal to the power source and wire feeder, it is contemplated that one or both controllers could be housed in modules external to the power source and wire feeder. In this regard, the communications network can take the form of a kit that can be used to retrofit existing welding systems. It is also contemplated that new systems could also be constructed with the communications modules secured to an external surface of the power source and/or wire feeder.

User interface 46 is designed to receive analog and/or discrete inputs from an operator that collectively define operation of a welding process. As wire feeder 14 supports digitized control of the welding process, the operator is able to input with a certain degree of specificity exact operating parameters via user panel 46. However, as welding system 10 is a remotely controlled system, the communications controller of the wire feeder 14 receives the user inputs whereupon those inputs are fed to the wire feeder transceiver for transmission to the power source communications controller across the weld cables.

Referring again to FIG. 3, as referenced above, welding power source 12 may include a low voltage DC power supply 36 that is used as a secondary source of power that may be delivered across weld cable 16 when the wire feeder 14 is in an ON, but non-welding state, i.e. standby. In this regard, the electronics to the wire feeder 14 are sufficiently powered thereby avoiding a "rebooting" of the wire feeder 14 between welding projects. One skilled in the art will appreciate, however, that after a specified time has elapsed since welding, the wire feeder 14 may be placed in shut-down. Although not preferred, a battery (not shown) may be disposed in the wire feeder to power the electronics of the wire feeder when a power is not being delivered by the power source. Accordingly, it is contemplated that the power source not provide any power to the wire feeder until commanded to do so by control commands received from the wire feeder. It is recognized that the battery may be a rechargeable battery and may be connected to the welding circuit such that recharging takes place during an active welding session.

As mentioned above, low voltage power supply 36, which may be incorporated within power source 12 or the external to the power source, is designed to provide a relatively low voltage power supply to the wire feeder during standby operation of the wire feeder. In a preferred embodiment, the low voltage supply is provided across the weld cable. As such, when the low voltage power supply 36 is integrally disposed within the power source 12, the power source will include a primary contactor, generally referenced as diode 42, as well as secondary contactor, generally referenced as diode 40, to control the flow of power between itself and the wire feeder. That is, a primary contactor 42 is electrically connected to primary power supply 38, i.e. a transformer which is designed to condition an input power from a utility or engine driven power supply into a form usable by a welding-type process, that will be used to control application of a welding (or relatively high) voltage between the wire feeder and the power source. In this regard, the primary contactor 42 is not closed so as to form a welding circuit between the wire feeder and the power source until specifically instructed to do so by operator commands received across weld cable 16 from the remote wire feeder 14.

On the other hand, the secondary contactor 40 which is electrically isolated from primary contactor 42 and is electrically connected to low voltage power supply 36, is used to control application of a low voltage power supply 36. That is, if the power source 12 is operating and connected to wire feeder 14 or some other remote device, a low voltage will be present across cable 16 to power electronics of the wire feeder or other remote device. During the welding process, however, the primary voltage, or a weld voltage, will be used or otherwise "tapped" into by the wire feeder to control its electronics. It is envisioned that the power source and the wire feeder each have at least three states—an OFF state, a welding (ON) state, and a standby state. Standby may be defined as a non-welding, ON state wherein the wire feeder and its electronics are energized but an active welding process is not taking place. It is desirable to put the wire feeder in standby during intervals between welding.

The voltage sensing receiver section of the remote control is configured to detect both start and reference commands. Therefore, a remote user can remotely switch ON the welding power output of the power source and set the magnitude of the power source output. The wire feeder also includes a current sensing circuit (not shown) that detects arc current and maintains the power source in an ON state while welding. The welding power output effectively supersedes the standby power output provided to power the wire feeder when in a standby state. That is, it is contemplated that the primary and the secondary contactor in the power source can be in a conductive state when welding but only the secondary contactor is conductive when the wire feeder is in standby. Also, the wire feeder preferably includes circuitry to effectively "tap" into the weld voltage for powering of its electronics during welding.

As described above, in a preferred embodiment, the wire feeder is constructed without a contactor that is typically used to close the welding circuit, i.e., allow delivery of welding power to the electrode. While preferred, the present invention is not so limited. That is, it is contemplated that the wire feeder could be constructed to have a contactor to close the welding circuit. In this regard, the power source is commanded, when ON, to provide a weld voltage to the wire feeder, but that weld voltage is not delivered to the electrode until the controller in the wire feeder causes closure of the contactor. In this regard, remote voltage control is provided without requiring remote state shifting of the power source from a stand-by state to the weld power delivery state. One advantage of such a construction is that the wire feeder electronics can be powered in a conventional manner directly from the open circuit voltage present across the weld cables. For those embodiments where it is desirable to avoid a dedicated wire feeder contactor, it is contemplated that either a non-welding voltage may be provided by the power source to the wire feeder to power the wire feeder electronics or, alternatively, the wire feeder may be equipped with a battery to provide operational power to the wire feeder electronics when a non-welding power is being delivered to the wire feeder by the power source.

Further, as described above, it is contemplated that the power source be remotely switched from a stand-by state to a weld state. In the stand-by state, the power source provides a low voltage, low current power to the wire feeder to sufficiently power the electronics of the wire feeder. In the weld state, the power source provides a high voltage, high current output to the wire feeder. However, in a further embodiment, it is contemplated that the power source may be remotely commanded to operate in an intermediate state. In this intermediate state, the power source provides a low voltage, medium current power to the wire feeder. In this state, the power source, like in the stand-by state, still provides a non-welding power, but provides additional power for those non-welding tasks that require more current draw than that provided by the power source when in the stand-by state. For example, the power source may be commanded to the intermediate state when the operator presses the JOG button on the wire feeder. In this regard, the wire feeder requests JOG power from the power source that when supplied by the power source energizes the drive motor of the wire feeder to jog the weld wire. It is recognized that jogging of the weld wire is an exemplary non-welding task and that other non-welding tasks are contemplated.

As stated above, the present invention is also applicable with non-MIG welding systems such as TIG and stick welders. Further, the aforedescribed circuitry may be implemented to automatically adjust the output of a power source to compensate for losses that occur across weld cables. That is, in some manufacturing and/or industrial settings, the weld is a relatively great distance from the power source. As such, the weld cables may be dozens to over a hundred feet in length. This weld cable length results in losses from the output terminal of the power source to the weld. Simply, the voltage at the output terminals of the power source (where the weld cable is connected to the power source) may be significantly more than the voltage across the weld. Accordingly, the present invention may be used to transmit a voltage feedback signal at the weld to the power source whereupon the master or other controller in the power source compares the voltage at the terminal to the voltage at the weld and adjusts the voltage at the terminal such that after the losses experienced across the weld cables, the voltage at the weld is at the level requested by the user.

Therefore, according to one embodiment of the present invention, a welding-type system has a power source designed to deliver power for a welding-type process. The power source may also be operable in a stand-by state, wherein the power source is itself powered but does not deliver power for the welding-type process. The welding system further has a remote device operably connected to receive power from the power source across a weld cable. A communications link is established between the power source and the remote device across the weld cable and is configured to carry control commands at least between the remote device and the power source. In one preferred aspect, the control commands are encoded using narrow-band phase shift key (PSK) modulation and are transmitted at a first frequency. If no response is received from the power source at the first frequency, the same command is retransmitted at a second frequency. In addition, the communications link also includes a sensor that detects when a trigger of the remote device is shifted to a weld start position and upon said detection causes the communications link to transmit a signal to the power source to shift from the stand-by state to the power deliver state.

In embodiment of the present invention, a welding-type system includes a power source which is able to deliver at least welding-type power at its terminal, a remote device which is connected to receive power from the power source via a cable connected to the terminal, a transmission assembly connected to the remote device that encodes control commands onto a carrier wave using phase shift keying (PSK) then transmits the encoded control commands across the cable, a receiver connected to the power source to receive and decode the encoded control commands, and at least one circuit connected to the cable that is configured to improve signal quality of the encoded control commands.

The present invention is also embodied in a method for manufacturing a remotely controllable welding-type system. The method includes the steps of providing a power source that selectively supplies welding power or standby power over a weld cable, operably connecting a remote device with operator controls to the weld cable, configuring the remote device to communicate to the power source over the weld cable via a transmission protocol whether the power source is supplying the welding power or the standby power, and improving transmission quality over the weld cable by filtering high frequency noise, increasing impedance at terminations thereof, or both.

In yet another embodiment of the invention, a communication assembly for a welding-type system includes a transmitter connected to a remote welding-type device. The transmitter is configured to transmit at least control commands over a weld cable. The communication assembly also includes a receiver connected to a power source. The receiver is configured to receive the control commands transmitted by the transmitter of the remote welding-type device over the weld cable. A controller is also included that is configured to adjust power source output according to the control commands. In addition, the communication assembly includes a signal-to-noise ratio coupling circuit which is connected to the output terminals of the power source, an input of the receiver, or both.

The present invention has been described in terms of the preferred embodiment, and it is recognized that equivalents, alternatives, and modifications, aside from those expressly stated, are possible and within the scope of the appending claims.

What is claimed is:

1. A welding system comprising: a transmission assembly comprising a first transceiver configured to encode control commands onto a carrier wave and to transmit the encoded control commands via the carrier wave at a first frequency via a weld cable connected between a welding power source and a welding wire feeder; a second transceiver configured to receive and decode the encoded control commands from the weld cable; and an LC tank circuit incorporated within the welding power source, parallel with a resistor and arranged across a conductor of the weld cable connected to a first terminal of the welding power source and configured to increase impedance between the welding power source and the weld cable at the first frequency corresponding to the carrier wave, thereby improving signal quality of the encoded control commands between the welding power source and another LC tank circuit incorporated within the welding wire feeder that is parallel with another resistor and connected to the LC tank circuit via the weld cable.

2. The system of claim 1, comprising a controller connected to the first transceiver and configured to process the control commands and adjust parameters based on the control commands.

3. The system of claim 2, wherein the control commands include at least one of voltage and current settings, output modes, trigger signals, ON-OFF commands, and wire feed settings.

4. The system of claim 1, wherein the transmission assembly is configured to transmit the encoded control commands to or from the welding power source when the welding power source is delivering welding power.

5. The system of claim 1, wherein the transmission assembly is configured to transmit the encoded control commands to or from the welding power source when the welding power source is not delivering welding power.

6. The system of claim 1, wherein the transmission assembly is configured to encode the control commands via either narrow band binary PSK (BPSK) or quadrature PSK (QPSK).

7. The system of claim 1, further comprising a noise-reducing capacitor arranged between the first terminal and a second terminal of the welding power source.

8. The system of claim 7, wherein the noise-reducing capacitor is arranged to perform as a low-pass filter.

9. The system of claim 1, comprising a first coupling circuit connecting the transmission assembly to the weld cable and a second coupling circuit connecting the receiver to the weld cable.

10. The system of claim 1, wherein the transmission assembly and the receiver bi-directionally transmit and receive the encoded control commands between the welding power source and the welding wire feeder device via the weld cable.

11. The system of claim 1, wherein the LC tank circuit comprises a capacitor and an inductor, wherein the first frequency corresponds to a peak impedance of the LC tank circuit, the LC tank circuit is tuned based on properties of the capacitor or the inductor.

12. The system of claim 1, wherein the noise-reducing capacitor is configured to improve signal quality of the encoded control commands by filtering high frequency noise from the carrier wave.

13. The system of claim 1, wherein the transmission assembly is configured to modulate messages onto the frequency corresponding to the carrier wave via phase shift keyed (PSK) modulation.

14. The system of claim 1, wherein the LC tank circuit is configured to increase the impedance at a termination of the weld cable at the frequency corresponding to the carrier wave.

15. A welding system comprising: a transmission assembly comprising a first transceiver configured to encode control commands onto a carrier wave and to transmit the encoded control commands via the carrier wave at a first frequency via a weld cable connected between a welding power source and a remote welding wire feeder; a second transceiver configured to receive and decode the encoded control commands from the weld cable; a noise-reducing capacitor arranged between terminals of the welding power source; a first LC tank circuit incorporated within the welding power source, parallel with a first resistor and arranged at a first terminal of the welding power source configured to increase impedance between the welding power source and the weld cable at the first frequency; and a second LC tank circuit incorporated within the remote welding wire feeder, parallel with a second resistor and arranged at a second terminal of the remote welding wire feeder configured to increase impedance between the weld cable and the receiver at the first frequency, wherein the first and second LC tank circuits are connected via the weld cable.

16. The system of claim 15, wherein the transmission assembly is configured to transmit the encoded control commands to the welding power source when the welding power source is delivering welding power and when the welding power source is not delivering welding power.

17. The system of claim 15, wherein the first LC tank circuit is arranged across a conductor of the weld cable connected to the first terminal of the welding power source.

18. The system of claim 15, wherein one or more of the first or second LC tank circuits comprises a capacitor and an inductor, wherein the first frequency corresponds to a peak impedance of the LC tank circuit, the LC tank circuit is tuned based on properties of the capacitor or the inductor.

* * * * *